(12) United States Patent
Arya

(10) Patent No.: US 8,726,130 B2
(45) Date of Patent: May 13, 2014

(54) DYNAMIC BUFFER MANAGEMENT IN A NAND MEMORY CONTROLLER TO MINIMIZE AGE RELATED PERFORMANCE DEGRADATION DUE TO ERROR CORRECTION

(75) Inventor: Siamak Arya, Cupertino, CA (US)

(73) Assignee: Greenliant LLC, Santa Clara, CA (US)

( * ) Notice: Subject to any disclaimer, the term of this patent is extended or adjusted under 35 U.S.C. 154(b) by 558 days.

(21) Appl. No.: 12/791,774

(22) Filed: Jun. 1, 2010

(65) Prior Publication Data

US 2011/0296276 A1    Dec. 1, 2011

(51) Int. Cl.
*G11C 29/00*    (2006.01)
*G11C 16/04*    (2006.01)

(52) U.S. Cl.
USPC ..................... 714/773; 365/185.33

(58) Field of Classification Search
USPC .......... 714/746, 718, 766, 773; 365/200, 201, 365/185.33, 230.03
See application file for complete search history.

(56) References Cited

U.S. PATENT DOCUMENTS

| | | | |
|---|---|---|---|
| 5,745,508 A * | 4/1998 | Prohofsky | 714/766 |
| 6,003,151 A | 12/1999 | Chuang | |
| 6,009,548 A * | 12/1999 | Chen et al. | 714/762 |
| 6,018,817 A * | 1/2000 | Chen et al. | 714/762 |
| 6,044,483 A * | 3/2000 | Chen et al. | 714/762 |
| 6,317,371 B2 | 11/2001 | Katayama et al. | |
| 6,499,082 B1 | 12/2002 | Lin et al. | |
| 6,731,537 B2 * | 5/2004 | Kanamori et al. | 365/185.08 |
| 7,073,099 B1 * | 7/2006 | Sutardja et al. | 714/710 |
| 7,116,578 B2 * | 10/2006 | Kanamori et al. | 365/185.08 |
| 7,428,161 B2 * | 9/2008 | Kanda | 365/63 |
| 7,940,575 B2 * | 5/2011 | Ravasio et al. | 365/189.02 |
| 7,962,809 B1 * | 6/2011 | Sutardja et al. | 714/718 |
| 8,037,358 B2 * | 10/2011 | Kuroyanagi | 714/36 |
| 2005/0005230 A1 | 1/2005 | Koga et al. | |
| 2007/0121359 A1 | 5/2007 | Kanda | |

(Continued)

FOREIGN PATENT DOCUMENTS

| | | |
|---|---|---|
| EP | 1 065 594 A2 | 1/2002 |
| JP | 10-143331 | 5/1998 |
| JP | 2008-4111 | 1/2008 |

OTHER PUBLICATIONS

PCT Search Report and Written Opinion mailed on Aug. 19, 2011 corresponding to the related PCT Patent Application No. US11/36669.
The Extended European Search Report dated Oct. 7, 2013 corresponding to the related European Patent Application No. 11790176.9.

(Continued)

*Primary Examiner* — Phung M Chung
(74) *Attorney, Agent, or Firm* — Brent Yamashita; DLA Piper LLP US

(57) ABSTRACT

An output buffer circuit for a non-volatile memory comprises an error check circuit, an error correction circuit, a switch circuit, and three storage circuits. The error check circuit receives the plurality of data bits and the plurality of ECC bits from the non-volatile memory to determine if the plurality of data bits need to be corrected and generates a correction signal. The error correction circuit receives the plurality of data bits and the plurality of ECC bits and generates a plurality of corrected data bits in response to the correction signal. A switch enables the output buffer circuit to concurrently performs operations of error check, error correction, and transfer of data bits out of the output buffer circuit on three distinct pluralities of data bits. The switch allows reallocation of storage circuits to different operations without any data transfer.

14 Claims, 4 Drawing Sheets

(56) References Cited

U.S. PATENT DOCUMENTS

2007/0168781 A1* 7/2007 Sutardja et al. ............... 714/718
2008/0008001 A1   1/2008 Kuroyanagi
2009/0141560 A1   6/2009 Park et al.
2009/0282308 A1* 11/2009 Gutsche et al. ............... 714/746

OTHER PUBLICATIONS

Japanese Office Action dated Jan. 6, 2014 pertaining to the related Korean Patent Application No. 2013-513197. (English and Japanese translations).

\* cited by examiner

# DYNAMIC BUFFER MANAGEMENT IN A NAND MEMORY CONTROLLER TO MINIMIZE AGE RELATED PERFORMANCE DEGRADATION DUE TO ERROR CORRECTION

TECHNICAL FIELD

The present invention relates to a buffering mechanism for use with a NAND memory controller, and more particularly, wherein the use of the buffer circuits serves to minimize the degradation of performance of the NAND memory caused by error correction overhead as the NAND memory ages.

BACKGROUND OF THE INVENTION

NAND memory integrated circuit chips are well known in the art. In a NAND memory chip, the memory is characterized by a number of blocks of storage, with each block containing a number of pages. The total amount of storage in each block is the minimum erasable unit. Further, each page contains a number of memory cells. In the past, a memory cell has stored a single bit, so called SLC (Single Level Cell). However, more recently, manufacturers of NAND memory integrated circuit chips have stored multi bits in each memory cell, so called MLC (Multi Level Cell). Whether memory cells are SLC or MLC, the charges stored in each cell may degrade. To recover "corrupt" or degraded data, data bits are accompanied by ECC (Error Checking and Correction) bits. These ECC bits are also stored in the accompanying memory cells of the NAND chip and are used to check for errors in the data cells and to correct them using well known algorithms, such as Reed-Solomon and BCH algorithms.

The problem with ECC bits is that as a NAND memory chip ages, the number of error bits will increase. This increase, however, affects performance non-linearly. Thus, if a 1 KB of data bits is read, and the NAND memory chip is "fresh" and relatively error free, the time required to check and correct output data bits may be only on the order of 0.5 usec. However, as the NAND memory chip ages, and more error bits occur, the same 1 KB of data bits may require 10 usec to be checked, corrected and outputted from the NAND memory chip. From the stand point of a system designer, the unpredictability of the performance is an area of concern. Thus, it is desired that even as a NAND memory chip ages and the number of error bits increases, the performance or the total amount of time required to read the same amount of data (including any checking and correction required) does not degrade.

Referring to FIG. 1 there is shown an output buffer circuit 10 of the prior art. A NAND memory 12 provides data output. The data bits and the accompanying ECC bits are supplied to a first multiplexer 14. From there the data is supplied either to a first buffer 16 or a second buffer 18. From the first buffer 16 or the second buffer 18, the data is supplied to a second MUX 20 as the output of the buffer circuit 10. The buffer circuit 10 is known as ping-pong circuit. In operation, the circuit 10 functions as follows. In a rust clock cycle T1, the data from the NAND memory 12 is passed through MUX 14 and is stored in buffer 16. The data in the buffer 16 is checked and corrected by ECC checking and correction circuits (not shown) if need be. In a second clock cycle T2, the data from the NAND memory 12 is passed through MUX 14 and stored in buffer 18 and the data in the buffer 18 is checked and corrected by ECC checking and correction circuits (not shown) if need be, while the data from the buffer 16 is passed through the MUX 20 as the output of the buffer circuit 10. In a third clock cycle T3, the data from the NAND memory 12 is passed through MUX 14 and stored in buffer 16 and the data in the buffer 16 is checked and corrected by ECC checking and correction circuits (not shown) if need be, while the data from the buffer 18 is passed through the MUX 20 as the output of the buffer circuit 10.

From the foregoing, it can be seen that the buffer circuit 10 of the prior art maintains the consistency of performance even as ECC degrades over time, so long as the error checking and correction can be performed in one clock cycle. However, this assumption is not true as more NAND memory chips use MLC memory cells and as the number of associated error correction bits increase. Hence there is a need to maintain the consistency of performance for a NAND memory chip even as ECC degrades over time.

SUMMARY OF THE INVENTION

An output buffer circuit for a non-volatile memory stores a plurality of data bits and a plurality of error correction check ("ECC") bits associated with the plurality of data bits. The output buffer circuit comprises an error check circuit for receiving the plurality of data bits and the plurality of ECC bits to determine if the plurality of data bits need to be corrected. The error check circuit supplies the plurality of data bits as its output, and generates a correction signal. An error correction circuit receives the plurality of data bits and the plurality of BCC bits and generates a plurality of corrected data bits in response to the correction signal. The output buffer circuit further has three or more storage circuits with each storage circuit having an input/output port. A bus connects to each of the storage circuits and to each other and supplies data bits between each storage circuit and between the nonvolatile memory and the storage circuits, and supplies data bits as the output of the output buffer circuit. A switch circuit is associated with each storage circuit for receiving the plurality of data bits; or the plurality of corrected data bits, and supplies same to the input/output port of the associated storage circuit and stores same as storage bits in the storage circuit, and supplies the storage bits as output of the storage circuit.

BRIEF DESCRIPTION OF THE. DRAWINGS

DETAILED DESCRIPTION OF THE PREFERRED EMBODIMENT

Figure 1:
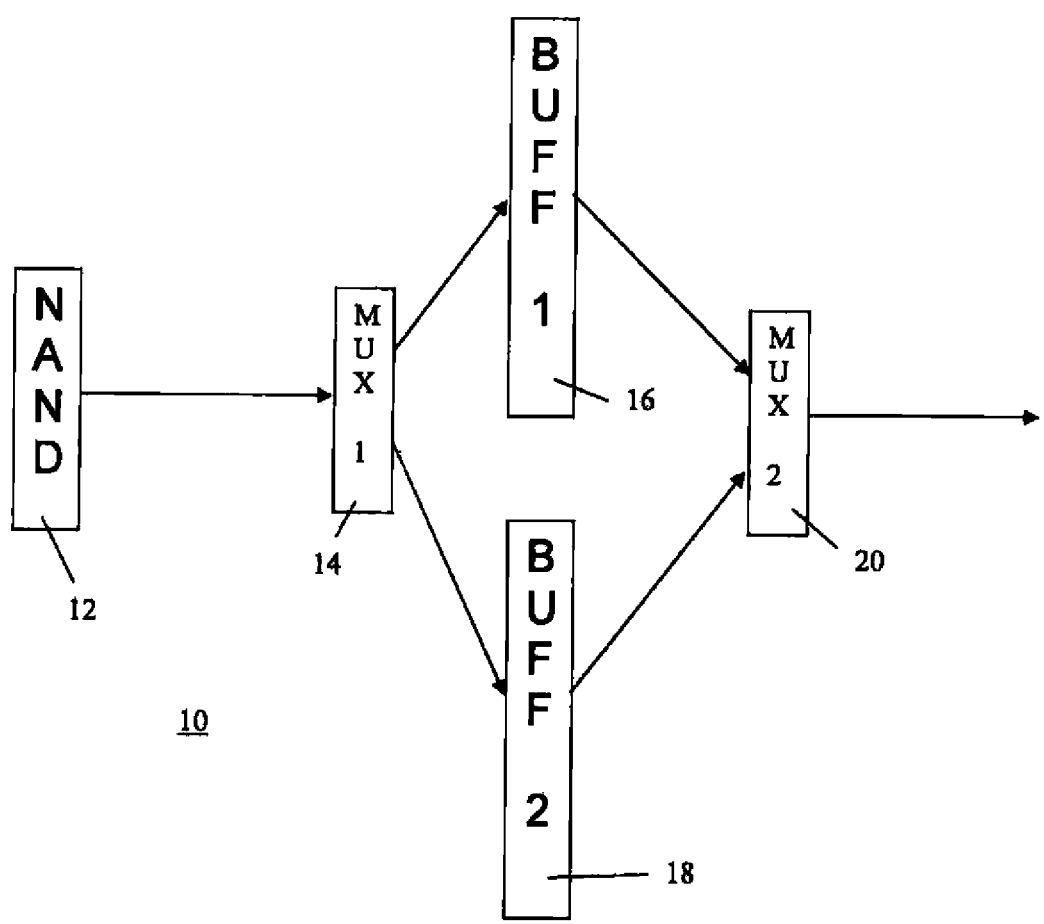
FIG. 1 is a block diagram of an output buffer circuit of the prior art.
Figure 2:
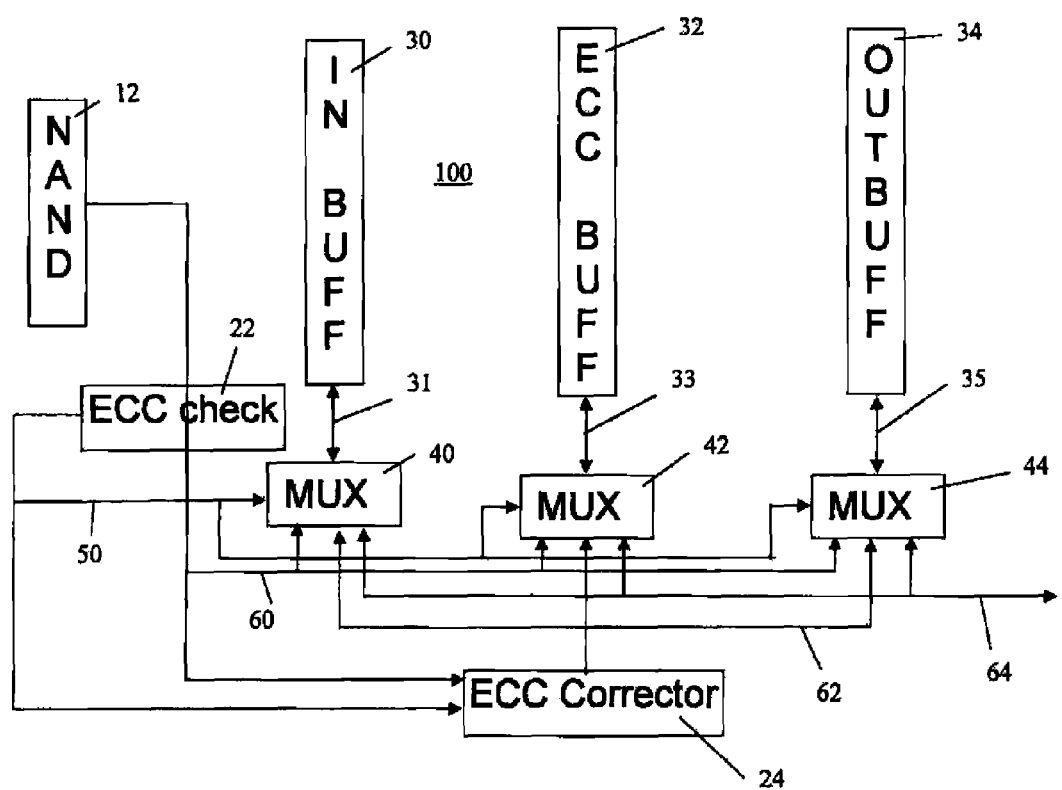
FIG. 2 is a block diagram of a first embodiment of an output buffer circuit of the present invention.

Referring to FIG. 2 there is shown a block level diagram of a first embodiment of an output buffer circuit 100 of the present invention for use with a NAND memory 12. The data output from the NAND memory 12, including a plurality of data bits, and the associated plurality of ECC bits are supplied to an error checking circuit 22, where the data bits and the ECC bits are checked by the ECC Check circuit 22 to determine if an error correction algorithm needs to be applied to the data bits. The ECC Check circuit generates as an output thereof a correction control signal, in the event the uncorrected data bits need to be corrected. Finally, the uncorrected data bits from the ECC Check circuit 22 are supplied along a data bus 60.

The ECC correction circuit 24 receives the uncorrected data bits and the associated ECC bits along the uncorrected bus 60 and performs a correction to the uncorrected data bits and generates a plurality of corrected data bits, in response to the correction control signal. The plurality of corrected data bits are supplied along the corrected data bus 62.

Three storage buffers 30, 32 and 34 are provided. Each storage buffer has an associated input/output port: 31, 33, and 35, respectively. The input/output ports 31, 33, 35 are connected to a MUX 40, 42 and 44 respectively. Each MUX 40, 42, and 44 has three inputs: 1) a first input connected to the uncorrected data bus 60 for receiving the uncorrected data bits from the ECC check circuit 22 or from the output of the NAND memory 12; 2) a second input connected to the corrected data bus 62, which receives the corrected data bits from the ECC correction circuit 24; and 3) a third input connected to an input/output bus 64 which is connected to all of the other MUXs and provides as an output of the output buffer circuit 100. The correction control signal front the ECC check circuit 22 controls the switching and the timing of thereof for each of the MUX 40, 42, and 44.

In the operation of the output buffer circuit 100, in a first clock cycle T1 after the start of a read operation, the data bits and the associated ECC bits are read from the NAND memory 12 and supplied to the ECC check circuit 22. The ECC check circuit 22 performs an operation to determine whether the data bits need any correction. The data bits are also sent and stored in the first buffer 30, irrespective of the result of the operation by the ECC check circuit 22.

In a second clock cycle T2, if the result of the ECC check circuit 22 shows that the data bits do not need any correction, then the uncorrected data from the first buffer 30 is outputted from the first buffer 30 and supplied along the bus 64, and stored in the third buffer 34. In that same clock cycle T2, if there is another read cycle, the data from the NAND memory 12 is read and is stored in the first buffer 30, as described above. Alternatively, the designation of the Mux 40, 42, 44 associated with the buffers 30, 32 and 34 may simply be switched without the data being outputted from one buffer and read into another buffer. Thus, alternatively, the buffer 30 may then be designated as the "out buffer 34" and the buffer 34 may be designated as a "in buffer" 30.

Assume now that NAND memory 12 has aged and error bits are encountered and the uncorrected data bits need to be corrected. In a first clock cycle after a read operation from the NAND memory 12, the uncorrected data bits are stored in the first buffer 30 and sent to the ECC correction circuit 24, as described above. If the ECC check circuit 22 determines correction is necessary, a correction control signal is generated which causes the ECC correction circuit 24 to commence the correction of the uncorrected data bits based upon the uncorrected data bits and the associated ECC bits. In addition, the ECC check 22 causes the "In buffer" 30 to be the "ECC Buffer" 32, and the ECC buffer 32 to be the In buffer 30.

In a second clock cycle T2, the uncorrected data bits are corrected by the ECC correction circuit 24, and stored in the second buffer 32, or are corrected in the buffer 32 directly. At the same time, if the NAND memory 12 is read again, then the uncorrected data bits from that read cycle is then stored in the first buffer 30.

In a third clock cycle T3, the corrected data bits stored in second storage buffer 32 are then read from the second storage buffer 32 and stored in the third storage buffer 34. At the same time, if the uncorrected data bits stored in the first storage buffer require correction, then those uncorrected data bits are corrected by the ECC correction circuit 24, and stored in the second storage buffer 32. Finally during this clock cycle, if uncorrected data bits are read, from the NAND memory 12, they are stored in the first storage buffer 30.

As can be seen from the foregoing, apart from the slight delay in the initial set up and storage of the uncorrected data, and the corrected data, data from the output buffer circuit 100 can be outputted at every clock cycle, thereafter.

Figure 3:
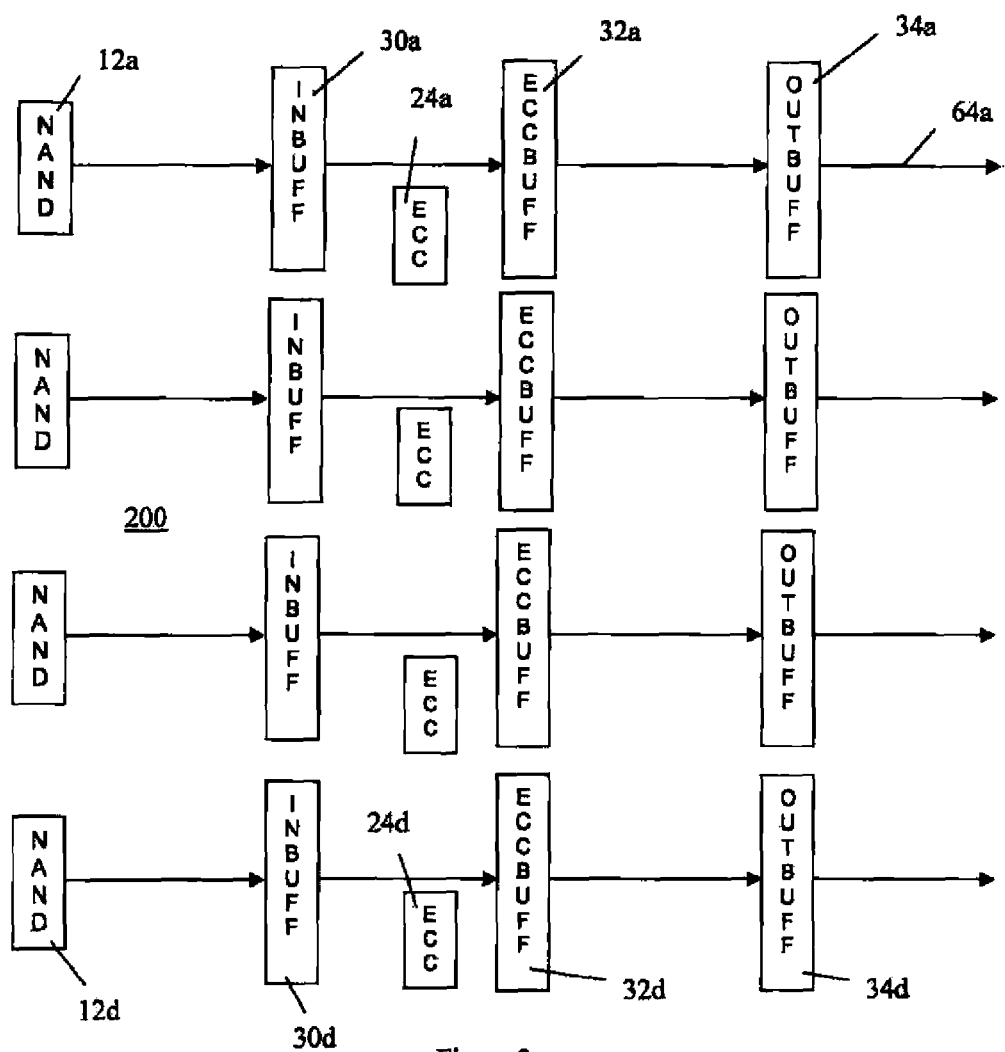
FIG. 3 is a block diagram of a first embodiment of a memory system showing a plurality of NAND memory chips using a plurality of output buffer circuits of the present invention.

Referring to FIG. 3, there is shown a block level diagram of a first embodiment of a memory system 200 using a plurality of the output buffer circuits 100 of the present invention. The memory system 200 comprises a plurality of NAND memories 12(a-d) (only 4 are shown for illustration purpose). Each of the NAND memories 12 has an associated output buffer circuit 100 shown and described in FIG. 2. For simplicity only a portion of the output buffer circuit 100 is shown in FIG. 3. Each of the output buffer circuit 100 is shown with an ECC correction circuit 24. Thus, as shown in FIG. 3, the memory system 200 comprises a plurality of NAND memories 24, each with an associated output buffer circuit 100, with each output buffer circuit 100 having a dedicated ECC correction circuit 24.

Figure 4:
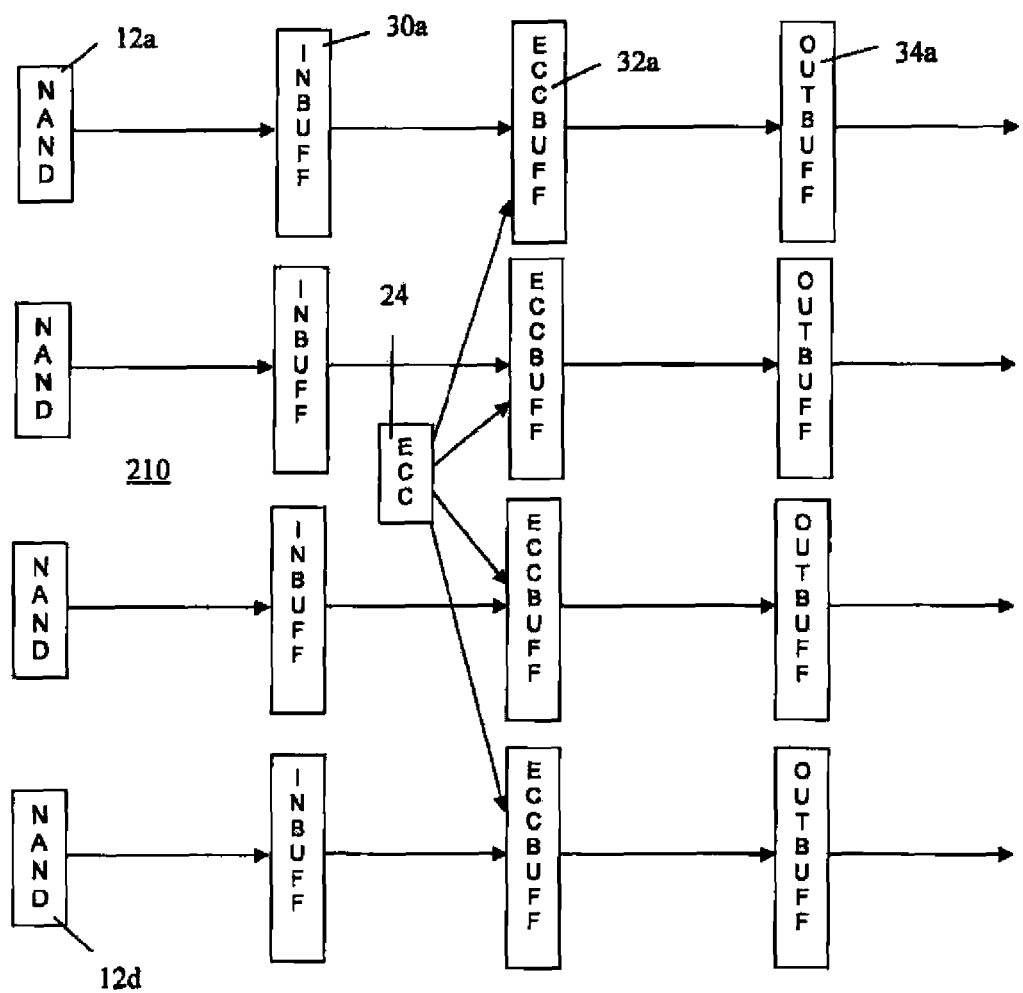
FIG. 4 is a block diagram of a second embodiment of a memory system showing a plurality of NAND memory chips using a plurality of output buffer circuits of the present invention.

Referring to FIG. 4, there is shown a block level diagram of a second embodiment of a memory system 210 using a plurality of the output buffer circuits 100 of the present invention. The memory system 210 comprises a plurality of NAND memories 12(a-d) (only 4 are shown for illustration purpose). Each of the NAND memories 12 has an associated output buffer circuit. 100 shown and described in FIG. 2. For simplicity only a portion of the output buffer circuit 100 is shown in FIG. 4. However, the plurality of output buffer circuits 100 all share a single ECC correction circuit 24. Thus, in this embodiment, if the ECC correction circuit 24 can perform rapid enough correction, then it can serve as the correction circuit for all four output buffers 100(a-d). Alternatively, if the NAND memories 12 are of sufficient reliability and quality where the frequency of error correction is low, then a single ECC correction circuit 24 may serve a plurality of output buffer circuits 100 as shown. In all other aspects the memory system 210 shown in FIG. 4 is similar to the memory system shown in FIG. 3.

From the foregoing, it can be seen that an output buffer circuit for a NAND chip is disclosed which can overcome the problem of ECC affecting performance as the NAND chip degrades over time.

What is claimed is:

1. An output buffer circuit for a non-volatile memory, said non-volatile memory for storing a plurality of data bits and a plurality of error correction check ("ECC") bits associated with said plurality of data bits, said output buffer circuit comprising:

an error check circuit for receiving the plurality of data bits and the plurality of ECC bits from the non-volatile memory to determine if the plurality of data bits need to be corrected, said error check circuit for supplying said plurality of data bits at an output, and for generating a correction signal;

an error correction circuit for receiving the plurality of data bits and the plurality of ECC bits from the error check circuit and for generating a plurality of corrected data bits in response to the correction signal;

a first storage circuit;

a second storage circuit;

a third storage circuit; and a switch circuit configurable to concurrently: transfer a first set of data from the non-volatile memory to the first storage circuit, transfer a second set of data from the error correction circuit to the second storage circuit, and transfer a third set of data from the third storage circuit as the output of said output buffer circuit;

wherein said error check circuit is configurable for controlling the operation of the switch circuit.

2. The output buffer circuit of claim 1, wherein said non-volatile memory is a NAND memory.

3. The output buffer circuit of claim 1, wherein said correction signal is supplied to the switch circuit for rotating the first storage circuit, second storage circuit, and third storage circuit between the error check circuit, the error correction circuit, and the output.

4. The output buffer circuit of claim 3, wherein said non-volatile memory is a NAND memory.

5. The output buffer circuit of claim 1, wherein the switch circuit can be configured to switch the designation of the first storage circuit, the second storage circuit, and the third storage circuit without any transfer of data between the first storage circuit, the second storage circuit, and the third storage circuit.

6. A memory device comprising:

a plurality of non-volatile memory circuits, each having a plurality of memory cells for storing a plurality of data bits and a plurality of error correction check ("ECC") bits associated with said plurality of data bits;

a plurality of error check circuits, each error check circuit associated with one of said plurality of non-volatile memory circuits, for receiving the plurality of data bits and the plurality of ECC bits from the associated non-volatile memory circuit to determine if the plurality of data bits need to be corrected; said error check circuit for supplying said plurality of data bits at an output, and for generating a correction signal;

a plurality of error correction circuits, each error correction circuit associated with one of said plurality of error check circuits with an associated non-volatile memory circuit, for receiving the plurality of data bits and the plurality of ECC bits from the associated non-volatile memory circuit and for generating a plurality of corrected data bits in response to the correction signal from the associated error check circuit;

three or more storage circuits, associated with each error correction circuit, and an associated error check circuit and an associated non-volatile memory circuit, with each storage circuit having an input/output port;

wherein each three or more storage circuits comprises a first storage circuit, a second storage circuit, and a third storage circuit;

a plurality of switch circuits, each switch circuit associated with an error correction circuit and an associated non-volatile memory circuit and an associated first storage circuit, second storage circuit, and third storage circuit, wherein each switch circuit is configured for concurrently: transferring a first set of data from the non-volatile memory to the first storage circuit, transferring a second set of data from the error correction circuit to the second storage circuit, and transferring a third set of data from the third storage circuit as the output of said output buffer circuit;

wherein the one of said plurality of error check circuits controls the operation of the associated switch circuit and the associated three or more storage circuits.

7. The memory device of claim 6, wherein said non-volatile memory circuit is a NAND memory.

8. The memory device of claim 6, wherein each said correction signal is supplied to an associated switch circuit for rotating the associated first storage circuit, second storage circuit, and third storage circuit between the associated error check circuit, the error correction circuit, and the output.

9. The memory device of claim 6, wherein each said switch circuit can be configured to switch the designation of the first storage circuit, the second storage circuit, and the third storage circuit without any transfer of data between the first storage circuit, the second storage circuit, and the third storage circuit.

10. A method of transferring data in a memory system, comprising:

transferring a first set of data from a non-volatile memory to a first storage circuit, transferring a second set of data from an error correction circuit to a second storage circuit, wherein the second set of data comprises data previously obtained from the first storage circuit and corrected by the error correction circuit; and transferring a third set of data from a third storage circuit as an output of said memory system, wherein the third set of data comprises data previously obtained from the second storage circuit;

wherein the transferring of the first set of data, transferring of the second set of data, and transferring of the third set of data occur concurrently.

11. The method of claim 10, wherein the non-volatile memory is a NAND memory.

12. The method of claim 10, wherein the transferring of the first set of data, transferring of the second set of data, and transferring of the third set of data occur over one or more buses.

13. The method of claim 12, wherein the non-volatile memory is a NAND memory.

14. The method of claim 10, wherein the transferring of the first set of data, transferring of the second set of data, and transferring of the third set of data occur through a switch circuit.

* * * * *